United States Patent [19]

Nakamura

[11] Patent Number: 5,072,139
[45] Date of Patent: Dec. 10, 1991

[54] INTERFACE CIRCUIT PREVENTING NOISE GENERATED BETWEEN INTEGRATED CIRCUITS

[75] Inventor: Michinori Nakamura, Yokohama, Japan

[73] Assignee: Kabushiki Kaisha Toshiba, Kawasaki, Japan

[21] Appl. No.: 343,203

[22] Filed: Apr. 26, 1989

[30] Foreign Application Priority Data

May 2, 1988 [JP] Japan .................. 63-109316

[51] Int. Cl.$^5$ .................. H03K 19/013; H03K 5/153
[52] U.S. Cl. ...................... 307/475; 307/454; 307/456; 307/570; 307/572; 307/362; 307/446; 307/443; 330/300; 330/311
[58] Field of Search ............... 307/443, 454, 446, 475, 307/570, 572, 542, 362, 363, 456; 328/187; 330/311, 300

[56] References Cited

U.S. PATENT DOCUMENTS

| 3,348,068 | 10/1967 | Miller | 307/362 |
| 3,411,017 | 11/1968 | Hoffman | 307/362 |
| 4,725,744 | 2/1988 | Yagyuu et al. | 307/455 |

FOREIGN PATENT DOCUMENTS 3518413 11/1985 Fed. Rep. of Germany .

WO89/01262 2/1989 PCT Int'l Appl. .

OTHER PUBLICATIONS

G. Glasford, "Analog Electronic Circuits", 1986, Section 5.2, pp. 182-185.
Ueda, Japanese Laid-Open Patent Application No. 56-106427 Patent Abstracts of Japan, Aug. 24, 1981, vol. 5, No. 179 (E-82) [851].
H. Liedl, "Pegal-Interface sziwschen den Schaltungssystemen TTL, LSL, und MOS", 1973, Bauteile Report, vol. 11, No. 4, pp. 92-96.

Primary Examiner—Stanley D. Miller
Assistant Examiner—Margaret Rose Wambach
Attorney, Agent, or Firm—Finnegan, Henderson, Farabow, Garrett, and Dunner

[57] ABSTRACT

An interface circuit includes a power source terminal, an input terminal and NPN transistor. Th interface circuit further includes a first resistor connected between the emitter of the NPN transistor and the input terminal, a second resistor connected between the collector of the NPN transistor and the power source terminal, a diode connected in a forward direction between the collector of the NPN transistor and the power source terminal and a voltage dividing circuit for biasing the base of the NPN transistor to a preset potential.

19 Claims, 3 Drawing Sheets

INTERFACE CIRCUIT PREVENTING NOISE GENERATED BETWEEN INTEGRATED CIRCUITS

BACKGROUND OF THE INVENTION

1. Field of the Invention

This invention relates to an interface circuit for inputting a digital signal to a bipolar integrated circuit, and more particularly to an interface circuit used for TV video reception processing.

2. Description of the related art

A video reception circuit of Improved Definition TV (IDTV) is constructed as shown in FIG. 1, for example. In the video reception circuit, tuner 11 detects a modulated video signal from a reception signal supplied via antenna 10, A/D converter 12 converts the modulated video signal into a corresponding digital signal, and video processor 13 demodulates the modulated video signal derived from A/D converter 12. The demodulation process includes a process for separating the digital video signal into original color signals of red, green and blue and a process for storing the digital video signal in a memory for each frame unit, for example. D/A converter 14 converts an output signal of video processor 13 into a corresponding analog signal which can be displayed on a display unit. Each function block is formed in the IC configuration and is connected to a corresponding function block.

In a case where video processor 13 and D/A converter 14 are respectively formed as MOS IC and bipolar IC, an interface circuit shown in FIG. 2 is formed in the chip of D/A converter 14, for example. The interface circuit includes bipolar transistors Q1 to Q7, resistors R1 to R5 and constant current source I1, and is connected to video processor 13 via line N1. CMOS circuit 21 constitutes the output section of video processor 13, and sets the potential of line N1 to ground potential level (=0 V) or VDD level (=5 V) according to digital signal DA1. The interface circuit detects the potential of line N1 and supplies output voltage OUT corresponding to the detected potential to D/A converter 14.

When the digital signal is supplied via line N1 which lies outside the MOS IC and bipolar IC chips, harmonics are generated from line N1. When the amplitude of the digital signal is as large as 5 V, the operation of tuner 11 is disturbed by the harmonics generated from line N1, significantly degrading the picture quality.

SUMMARY OF THE INVENTION

An object of this invention is to provide an interface circuit capable of suppressing generation of harmonics.

The object can be attained by an interface circuit comprising an input terminal; a power source terminal to be set at a positive potential; an NPN transistor having a base, a collector and an emitter; a first resistor connected between the emitter of the NPN transistor and the input terminal; a second resistor connected between the collector of the NPN transistor and the power source terminal; a diode connected in a forward direction between the collector of the NPN transistor and the power source terminal; and a bias circuit for biasing the base of the NPN transistor to a preset potential.

With the above interface circuit, whether the input terminal is grounded or not can be detected based on the collector current of the NPN transistor. The output potential derived from the collector of the NPN transistor is set to substantially the same potential of the power source terminal when it is detected that the input terminal is set in the high impedance condition, and set to a potential level lower than the potential of the power source terminal when it is detected that the input terminal is set in the grounded condition. The potential of the input terminal is slightly changed with variation thereof from one condition to the other. In this case, it is not necessary to detect the potential variation as a digital signal and the potential variation will not be so large as to incur harmonics. Therefore, when the interface circuit is used for TV video reception processing, the degradation in the picture quality due to harmonics can be suppressed.

DETAILED DESCRIPTION OF THE PREFERRED EMBODIMENTS

Figure 1:
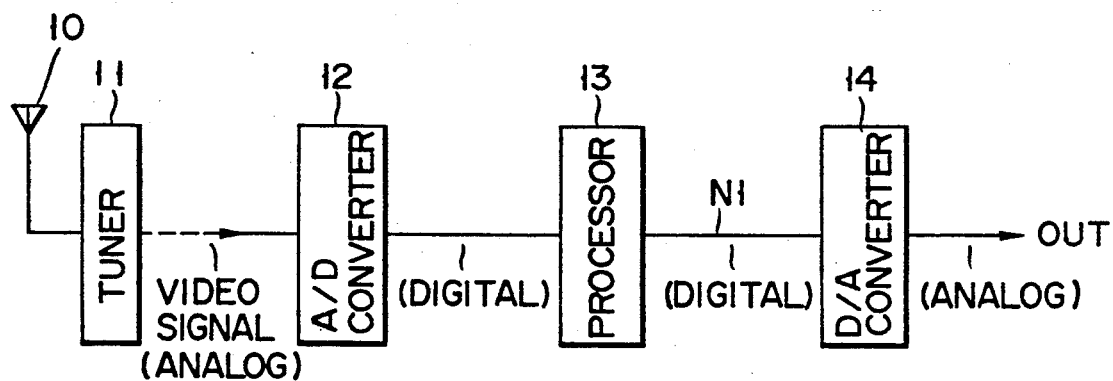
FIG. 1 is a block diagram schematically showing a video reception circuit of Improved Definition TV (IDTV)
Figure 3A:
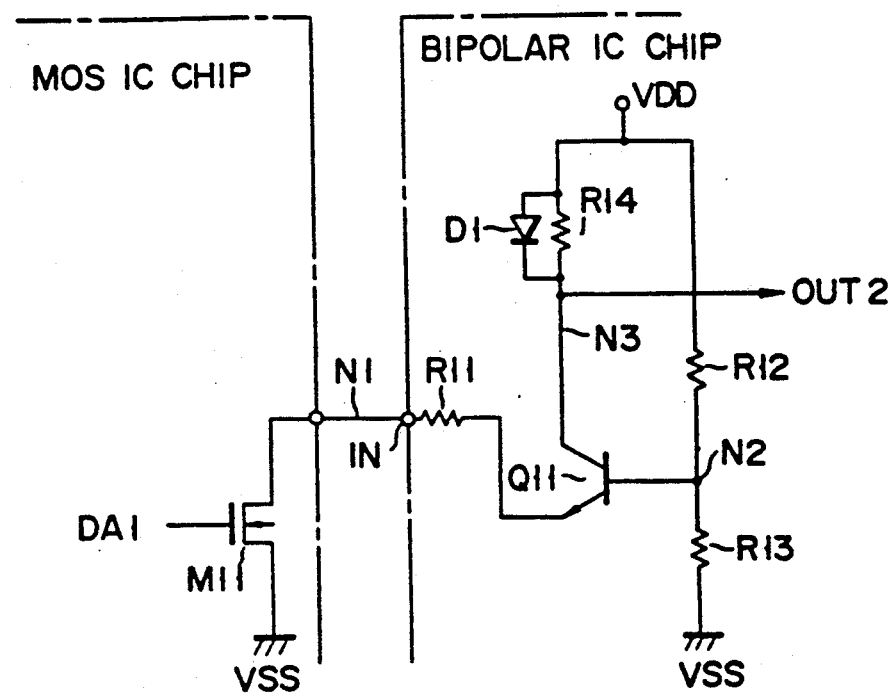
FIG. 3a & 3b is a circuit diagram showing an interface circuit according to one embodiment of this invention.
Figure 4A:
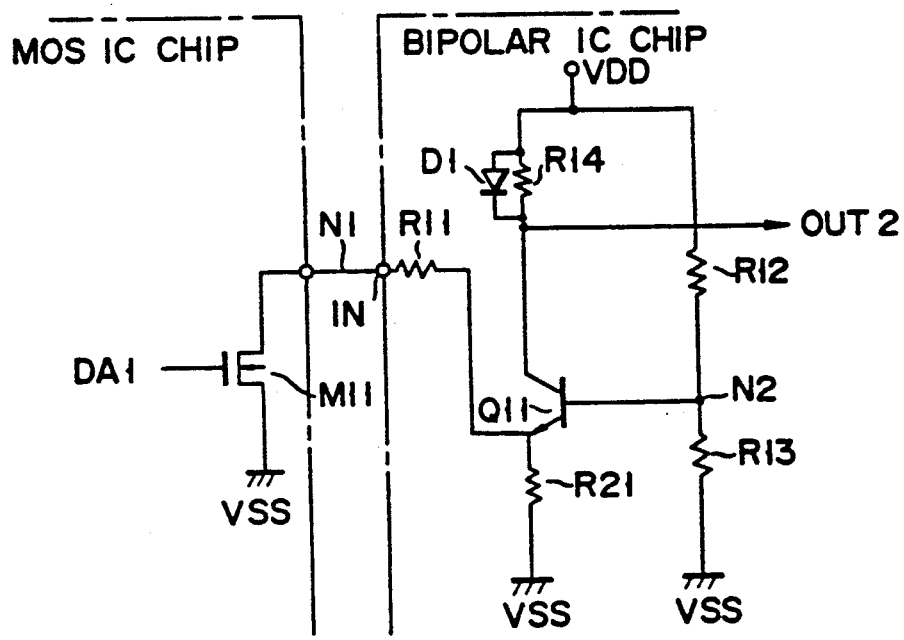
FIG. 4a & 4b is a circuit diagram showing an interface circuit according to another embodiment of this invention which is obtained by improving the response characteristic of the interface circuit of FIG. 3.
Figure 3B:
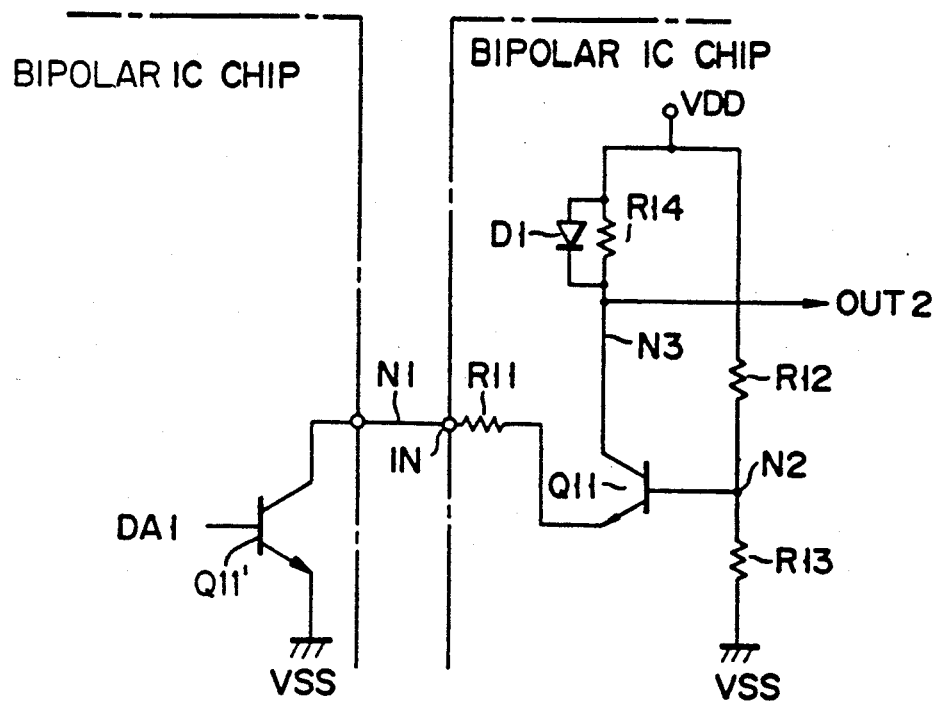
Figure 4B:
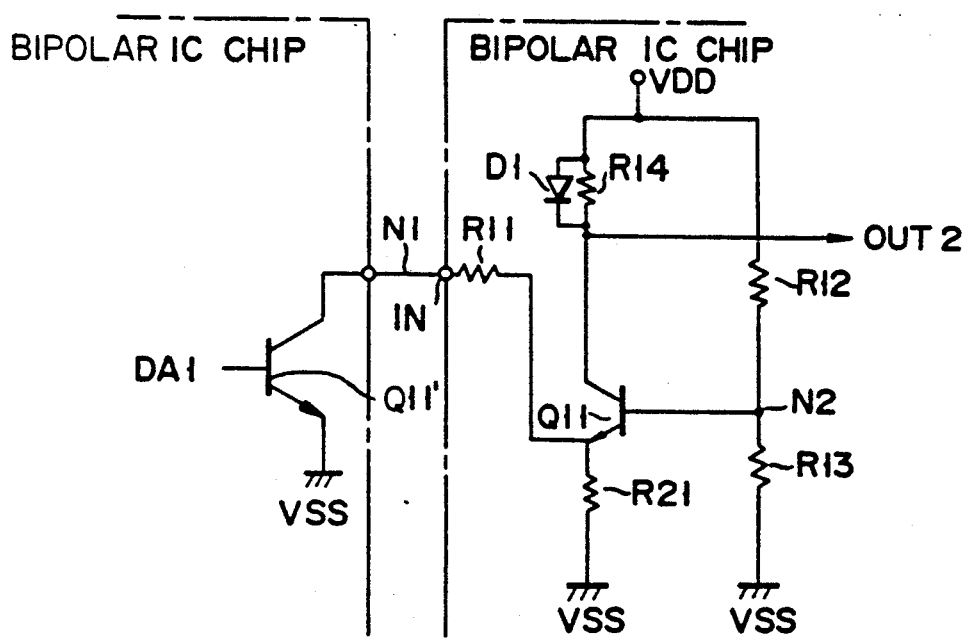

Now, an interface circuit according to one embodiment of this invention is explained with reference to FIG. 3. The interface circuit is used for supplying an output signal of video processor 13 to D/A converter 14 in the video reception circuit of Improved Definition TV (IDTV) shown in FIG. 1, for example. In this case, the interface circuit is formed in the bipolar IC chip of D/A converter 14 as in the prior art case.

The interface circuit includes input terminal IN, resistors R11 to R14, NPN transistor Q11, diode D1, power source terminal VDD and ground terminal VSS. Power source terminal VDD and ground terminal VSS are respectively set at potentials of VDD level (=5 V) and VSS level (=0 V). Resistor R11 is connected between input terminal IN and the emitter of NPN transistor Q11, resistors R12 and R13 are serially connected between power source terminal VDD and ground terminal VSS. The base of NPN transistor Q11 is connected to a connection node between resistors R12 and R13. Resistor R14 is connected between the collector of NPN transistor Q11 and power source VDD, and diode D1 is connected in a forward direction between power source terminal VDD and the collector of NPN transistor Q11. The collector of NPN transistor Q11 serves as output terminal OUT2 of the interface circuit. The resistances of resistors R11, R12, R13 and R14 are respectively set at 1 KΩ, 3.3 KΩ, 1.7 KΩ and 700Ω.

In a case where the interface circuit is formed with the above construction, n-channel MOS transistor M11 is formed in a MOS IC chip of video processor 13. The current path of MOS transistor M11 is connected between input terminal IN and ground terminal VSS, and the gate of MOS transistor M11 is supplied with digital signal DA1. MOS transistor M11 selectively connects input terminal IN to the ground terminal according to digital signal DA1 so as to supply digital signal DA1 to the interface circuit.

In operation, when digital signal DA1 is set at the ground potential level, MOS transistor M11 is set in the non-operative condition to prevent current from flowing in transistor Q11. At this time, the potential of node N3 is set at substantially the VDD level, and the potential of input terminal IN is set to a potential level ($=1$ V) less than the base potential ($=1.7$ V) of transistor Q11 by base-emitter voltage VBE ($=0.7$ V). When the gate potential of MOS transistor M11 rises, MOS transistor M11 is turned on to lower the potential of input terminal IN.

When the potential of input terminal IN becomes 0.5 V, the following current flows in transistor Q11:

$$(1 \text{ [V]} - 0.5 \text{ [V]})/R11 = 0.5 \text{ [V]}/1 \text{ [K}\Omega\text{]} = 500 \text{[}\mu\text{A]}$$

At this time, the potential of node N3 becomes as follows:

$$VDD - R14 \times 500 \text{ [}\mu\text{]} = 5 \text{ [V]} - 700 \text{ [}\Omega\text{]} \times 500 \text{ [}\mu\text{A]} = 4.65 \text{ [V]}$$

If the gate potential of MOS transistor M11 further rises, the potential of input terminal IN becomes substantially 1 V, causing a current of 1 mA to flow in transistor Q11. At this time, the potential of node N3 is clamped by forward voltage VF ($=0.7$ V) of diode D1 and set to the following potential level:

$$VDD - VF = 5 - 0.7 = 4.3 \text{ [V]}$$

That is, the potential of node N3 varies from 4.3 V to 5 V. Therefore, only if the threshold voltage of D/A converter 14 is set to an intermediate potential level ($=4.6$ V) of the potential variation range, digital signal DA1 may be correctly transmitted to D/A converter 14.

In the interface circuit of this embodiment, the potential of input terminal IN varies from 0 V to 1 V, and the variation is so small that occurrence of harmonics can be sufficiently suppressed. As a result, degradation of the picture quality can be prevented.

The interface circuit includes transistor Q11 which is set into the cut-off condition. Since the switching time of transistor Q11 depends on the stray capacitance of the current path including transistor Q11, the interface circuit cannot sometimes operate at such a sufficiently high speed as to correctly respond to digital signal DA1 of high bit rate.

Figure 2:
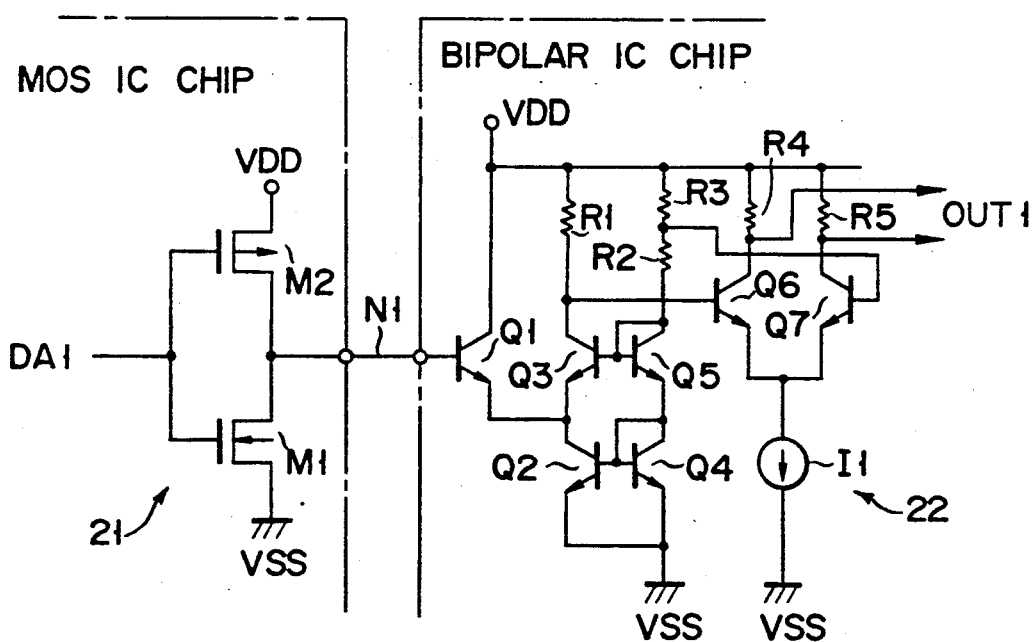
FIG. 2 is a circuit diagram showing the conventional interface circuit for supplying an output signal of the video processor of FIG. 1 to a D/A converter.

FIG. 2 shows the construction of an interface circuit according to a second embodiment of this invention. The interface circuit is similar to that of FIG. 1 except that resistor R22 is additionally connected between the emitter of transistor Q11 and ground terminal VSS. The resistance of resistor R22 is 5 K$\Omega$, for example. Resistor R22 is used to always supply a current to transistor Q11 so as not to completely turn off transistor Q11. In this case, the response characteristic of the interface can be improved over that of the interface of FIG. 1.

This invention is not limited to the above embodiments, and can be variously modified without departing from the technical scope thereof. In the above embodiments, the interface circuit is used to supply an output signal of the MOS IC to the bipolar IC. However, it is possible to use the interface circuit so as to supply an output signal of the bipolar IC to another bipolar IC. In this case, an open-collector output type bipolar transistor is formed in the bipolar IC chip instead of open-drain output type MOS transistor M11 formed in the MOS IC chip, and is connected to the interface circuit.

Further, the interface circuit of the above embodiment can be operated in response to digital signal DA1 supplied via CMOS circuit 21 shown in FIG. 2. Therefore, if it is not necessary to suppress occurrence of harmonics, the interface circuit may be connected to CMOS circuit 21 shown in FIG. 2.

What is claimed is:

1. An interface circuit comprising:
   an input terminal;
   a power source terminal to be set at a positive potential;
   an NPN transistor having a base, a collector and an emitter;
   first resistor means connected between the emitter of NPN transistor and said input terminal;
   second resistor means connected between the collector of said NPN transistor and said power source terminal;
   diode means connected in a forward direction between the collector of said NPN transistor and said power source terminal;
   bias means for biasing the base of said NPN transistor to a preset potential;
   third resistor means for grounding the emitter of said NPN transistor; and
   switching means, formed in an IC chip different from an IC chip in which said input terminal, power source terminal, NPN transistor, first resistor means, second resistor means, diode means, and bias means are formed, for selectively grounding said input terminal, wherein said switching means is an open-drain output type MOS transistor.

2. An interface circuit according to claim 1, wherein said bias means includes a voltage divider for dividing the potential of said power source terminal.

3. An interface circuit according to claim 2, wherein said voltage divider includes fourth resistor means grounded at one end and fifth resistor means connected between the other end of said fourth resistor means and said power source terminal, and the base of said NPN transistor is connected to a connection node between said fourth and fifth resistor means.

4. An interface circuit for coupling a bipolar IC chip to an MOS IC chip, comprising:
   an input terminal in the bipolar IC chip;
   an NPN transistor in the bipolar IC chip having a base, a collector, and an emitter;
   first means in the bipolar IC chip for resistively coupling the emitter of the NPN transistor to the input terminal;
   second means in the bipolar IC chip for resistively coupling the collector of the NPN transistor to a first positive potential;
   diode means in the bipolar IC chip for coupling the first positive potential to the collector of the NPN transistor in a forward direction;
   bias means in the bipolar IC chip for biasing the base of the NPN transistor to a second positive potential lower than the first positive potential; and
   switching means in the MOS IC chip, and coupled to the input terminal in the bipolar IC chip, for selectively coupling said input terminal to a third potential lower than the first and second positive potentials in accordance with a digital signal, wherein said switching means is an open-drain output type MOS transistor.

5. An interface circuit in accordance with claim 4, and further comprising:
a power source terminal in the bipolar IC chip, coupled to the second means and to the diode means, to be set at the first positive potential.

6. An interface circuit in accordance with claim 5, and further comprising:
third means in the bipolar IC chip for resistively coupling the emitter of the NPN transistor to the third potential.

7. An interface circuit in accordance with claim 4, and further comprising:
third means in the bipolar IC chip for resistively coupling the emitter of the NPN transistor to the third potential.

8. An interface circuit in accordance with claim 7, in which the bias means comprises a voltage divider coupled between the first positive potential and the third potential.

9. An interface circuit in accordance with claim 6, in which the bias means comprises a voltage divider coupled between the first positive potential and the third potential.

10. An interface circuit in accordance with claim 5, in which the bias means comprises a voltage divider coupled between the first positive potential and the third potential.

11. An interface circuit in accordance with claim 4, in which the bias means comprises a voltage divider coupled between the first positive potential and the third potential.

12. An interface circuit for coupling a first bipolar IC chip to a second bipolar IC chip, comprising:
an input terminal in the first bipolar IC chip;
an NPN transistor in the first bipolar IC chip having a base, a collector, and an emitter;
first means in the first bipolar IC chip for resistively coupling the emitter of the NPN transistor to the input terminal;
second means in the first bipolar IC chip for resistively coupling the collector of the NPN transistor to a first positive potential;
diode means in the first bipolar IC chip for coupling the first positive potential to the collector of the NPN transistor in a forward direction;
bias means in the first bipolar IC chip for biasing the base of the NPN transistor to a second positive potential lower than the first positive potential; and
switching means in the second bipolar IC chip, and coupled to the input terminal in the first bipolar IC chip, for selectively coupling said input terminal to a third potential lower than the first and second positive potentials in accordance with a digital signal, wherein said switching means is an open-collector output type bipolar transistor.

13. An interface circuit in accordance with claim 12, and further comprising:
a power source terminal in the first bipolar IC chip, coupled to the second means and to the diode means, to be set at the first positive potential.

14. An interface circuit in accordance with claim 13, and further comprising:
third means in the first bipolar IC chip for resistively coupling the emitter of the NPON transistor to the third potential.

15. An interface circuit in accordance with claim 12, and further comprising:
third means in the first bipolar IC chip for resistively coupling the emitter of the NPN transistor to the third potential.

16. An interface circuit in accordance with claim 15, in which the bias means comprises a voltage divider coupled between the first positive potential and the third potential.

17. An interface circuit in accordance with claim 14, in which the bias means comprises a voltage divider coupled between the first positive potential and the third potential.

18. An interface circuit in accordance with claim 13, in which the bias means comprises a voltage divider coupled between the first positive potential and the third potential.

19. An interface circuit in accordance with claim 12, in which the bias means comprises a voltage divider coupled between the first positive potential and the third potential.

* * * * *

UNITED STATES PATENT AND TRADEMARK OFFICE
CERTIFICATE OF CORRECTION

PATENT NO. : 5,072,139
DATED : December 10, 1991
INVENTOR(S) : Michinori Nakamura It is certified that error appears in the above-identified patent and that said Letters Patent is hereby corrected as shown below:

Claim 1, column 4, line 17, insert "said" after "emitter of".

Claim 14, column 6, line 22, change "NPON" to --NPN--.

Signed and Sealed this

Eighth Day of June, 1993

Attest:

MICHAEL K. KIRK

Attesting Officer     Acting Commissioner of Patents and Trademarks